United States Patent [19]

Sullivan

[11] Patent Number: 5,451,955
[45] Date of Patent: Sep. 19, 1995

[54] DIGITAL AMPLITUDE QUANTIZER

[75] Inventor: William B. Sullivan, Verona, N.J.

[73] Assignee: Wide Band Systems, Inc., Franklin, N.J.

[21] Appl. No.: 130,388

[22] Filed: Oct. 1, 1993

[51] Int. Cl.6 .............................................. H03M 1/12
[52] U.S. Cl. ..................... 341/200; 341/155
[58] Field of Search ....................... 341/200, 144, 155; 330/295, 302, 150

[56] References Cited

U.S. PATENT DOCUMENTS

| | | |
|---|---|---|
| 3,579,190 | 5/1971 | Karras .......................... 340/825.45 |
| 5,101,211 | 3/1992 | Dufort ............................. 342/174 |
| 5,365,238 | 11/1994 | Sullivan ........................... 342/195 |

Primary Examiner—Brian K. Young
Attorney, Agent, or Firm—Zachary T. Wobensmith, III

[57] ABSTRACT

A digital amplitude quantizer is disclosed having sequential stages each for measuring a selected portion of the overall range of the level of power of applied RF signals. Each of the sequential stages comprises a serial arrangement of a directional coupler, a detector, an amplifier, and an analog-to-digital converter. The directional coupler of each stage is activated when it receives a predetermined level of power of the applied RF signals. The sequential stages further comprise a series arrangement of PROMs and latches that are shared by adjacent stages. In operation, the RF amplifier in the uppermost or last stage is commonly driven into its limiting condition by appropriate RF signals. When the uppermost stage is nearly into its limiting operation, the directional coupler in the preceding stage receives a sufficient level of power of the RF signals and continues to do so until its related RF amplifier is also driven into limitation. When this preceding stage is nearly into its limiting operation, the next lower stage is activated and begins its operation. This sequential or chain like interrelationship continues until all the stages in the quantizer participate in the measurement of the overall range of power of the applied RF signals. Also, in operation, shared PROMs generate a digital quantity and control their latches so that a composite digital representation is provided and indicates the power level of the applied RF signals.

20 Claims, 2 Drawing Sheets

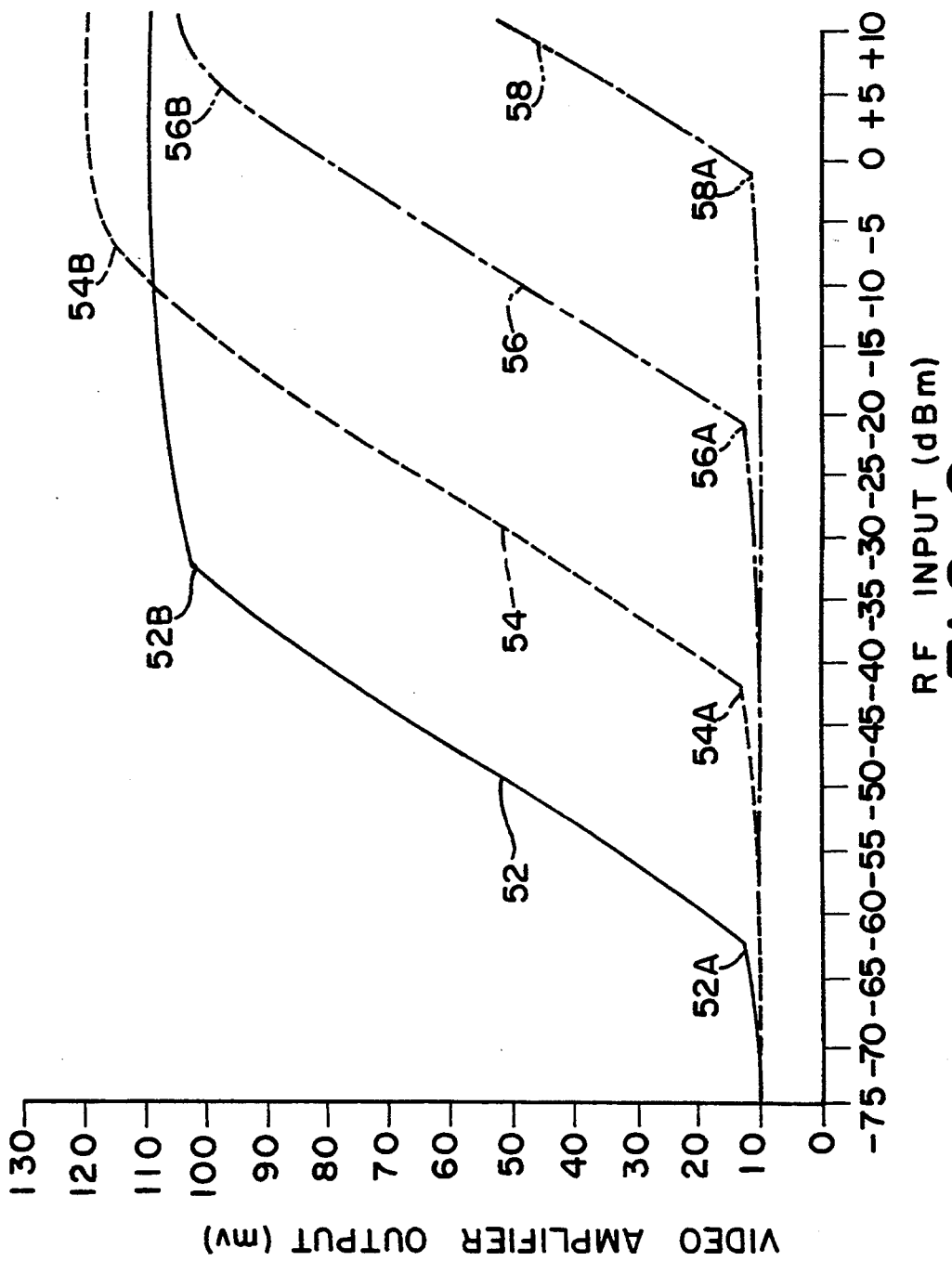

DIGITAL AMPLITUDE QUANTIZER

FIELD OF THE INVENTION

The present invention relates to a circuit arrangement for providing a digital measurement of the power level of radio frequency (RF) signals. More particularly, the present invention relates to a digital amplitude quantizer that measures transient or continuous RF signals and provides a digital representation thereof. Specifically, the present invention relates to a digital amplitude quantizer having an accurate and monotonic operation that provides subdivisions in which the RF signals are detected, measured and converted into digital quantities and combines the digital quantities into a composite digital representation.

BACKGROUND OF THE INVENTION

Circuits for measuring the level of RF signals are well known and the earlier of such circuits are of the analog type that utilize two separate stages in which the first stage comprises one or more diodes for modulating and detecting the RF signals and one or more RF amplifiers for amplifying the detected signal. The second stage comprises an analog-to-digital converter. Although the analog circuits serve their intended purpose and advantageously achieve a dynamic range between 30 db to about 70 db, the circuits are somewhat difficult to implement because some of the related RF amplifiers have to be properly aligned; i.e., preset to the RF signals being measured and detected. Not only is the alignment difficult but it also limits the bandwidth of the RF signals that can be measured. Furthermore, the recovery time; i.e., the time for a circuit to recover from momentary overdrives of applied RF signals, are relatively long having a duration of between 300 to 1,000 nanoseconds (nS) primarily due to the inherent operation of the analog circuit components.

Circuit arrangements having built-in analog-to-digital converters that measure and provide a digital representation of applied RF signals are known in the art. One such known circuit utilizes a chain of RF amplifiers that are interconnected to each other by a signal path to which are coupled directional couplers each of which couples a portion of the applied RF signals when such RF signals reach a predetermined power level. The coupled signal from each directional coupler then passes through a diode detector, an amplifier typically being a video amplifier, and to a parallel arrangement of an analog-to-digital converter and a comparator circuit. The RF signals are amplified by the chain of the RF amplifiers each having a designated level limiting its peak amplitude output. The limited RF amplifiers are arranged wherein the lowermost or first RF amplifier receives the RF signals and then the RF signals are increasingly amplified by subsequent RF amplifiers until the RF signals are developed at the uppermost RF amplifier. Commonly, a low level RF input signal is amplified by the chain of RF amplifiers and then first detected by a diode detector on the output stage of the uppermost amplifier. Commonly during such operation, increases in the RF input power level cause the uppermost amplifier to be driven into its limiting condition. However, just before such limitation occurs, the directional coupler and its diode detector on the output stage of the prior amplifier receives a sufficient power level of the RF signals to initiate its operation as well as the operation of its analog-to-digital converter. Similarly, just before this prior RF amplifier goes into its limiting condition, the next or lower prior detector located on the output stage of this next prior RF amplifier receives a sufficient power level of the RF signals to initiate its operation. This chain like reaction continues until the detector at the input stage of the lowermost or first RF amplifier receives a sufficient power level of the RF signals so that its related analog-to-digital converter provides a digital representation on the received RF signals. This prior circuit arrangement serves well its intended purpose, but suffers from the drawback that it lacks a monotonic operation. More particularly, increases in the power level of the applied RF signals do not necessarily cause a smooth increase in the output digital representation. This non-monolithic operation is primarily caused by the use of comparator circuits that are used to switch between the different RF amplifiers of the sequential circuit arrangement. More particularly, the comparator circuits, in cooperation with switching logic, are used to determine which analog-to-digital converter of which respective RF amplifier is to supply the digital output representative of the applied RF signals. Each comparator circuit uses a predetermined threshold value to determine the activation of the analog-to-digital converters. This threshold value is dependent upon fixed voltages that fail to take into account the variations of the RF amplifier's gain due to frequency or temperature changes. Because of this fixed threshold value, the comparator circuit erroneously allows switching between the different chained RF amplifiers which, in turn, causes an inaccurate measurement of the level of the RF signals. It is desired that means be provided that are not susceptible to variations in the components of the circuit that it controls so as to allow for a more accurate measurement of the power level of RF signals.

It is, therefore, a primary object of the present invention to provide a circuit arrangement for measuring the power level of the RF signals that is not susceptible to inaccuracies caused by variations in the circuit elements while still providing a relatively low recovery time.

It is another object of the present invention to provide for an accurate measurement of the power level of transient or continuous RF signals over a wide dynamic power range and for generating a digital representation of such measurement.

It is a further object of the present invention to provide a circuit arrangement generating a digital representation indicative of the power level of the various RF signals while still providing a monotonic operation that follows any increases in the level of the RF signals and causes a corresponding smooth increase in the digital representation.

It is a further object of the present invention to provide means so that the applied RF signals are accurately sampled; i.e., sampled at their half-power points.

Other objects of the present invention, as well as the advantages thereof over exisiting and prior art forms, which will be apparent in view of the following detailed description are accomplished by means hereinafter described and claimed.

SUMMARY OF THE INVENTION

The present invention is directed to a digital amplitude quantizer that measures the power level of applied RF signals and which comprises sequential stages each for detecting and measuring a selected portion of the power level of the applied RF signals and wherein each measured portion is combined to provide a composite digital representation of the power of the applied RF signals.

In general, the digital amplitude quantizer divides the range of the power level of the applied RF signals into subranges and then measures and provides a digital output signal for each subrange which are combined to provide a composite digital representation. The digital amplitude quantizer has a predetermined number (n) of stages and comprises a plurality of serial arranged RF amplifiers of the number (m) which is one less than the number (n) of stages. The digital amplitude quantizer further comprises serially arranged coupling, detecting, amplifying and analog-to-digital converter means each of the number (n), parallel arranged PROMs of the number (m), and a plurality of latches of the number (m). The first or lowermost of the RF amplifiers receives the RF signals to be measured and the last or uppermost RF amplifier of the RF amplifiers provides the final amplification of the received RF signals. Each of the RF amplifiers has a designated level which limits its peak amplitude output and each has a predetermined propogation time. Each of the serial arranged RF amplifiers has an input and an output stage and shares a signal path that carries the RF signals. The plurality of serial arranged coupling, detecting, amplifying and analog-to-digital converter means are arranged so that one of each serial arrangement is located at both the input and output stages of each of the RF amplifiers. The coupling means is adjusted, relative to the signal path, so as to have a portion of the power level of the RF signals transferred thereto when the RF signals reach a predetermined power level. Each of the PROMs have prestored information and are interconnected between the outputs of adjacent analog-to-digital converter means. Each of the PROMs are shared between the adjacent analog-to-digital converters and provides a digital output that is composed of the contents of shared analog-to-digital converters and further provides a control signal that is determined by the composite contents of the respective PROM. Each of the latches is arranged to receive the digital output of a respective PROM in response to the respective control signal.

The present invention also provides a method for measuring the level of power of the applied RF signals and providing a digital output representative of the measured power.

BRIEF DESCRIPTION OF THE DRAWINGS

FIG. 2 illustrates the interrelationship of the various stages of the circuit arrangement of FIG. 1 relative to their selected portions of the overall range of the applied RF signal.

DETAILED DESCRIPTION OF THE PREFERRED EMBODIMENTS

Figure 1:
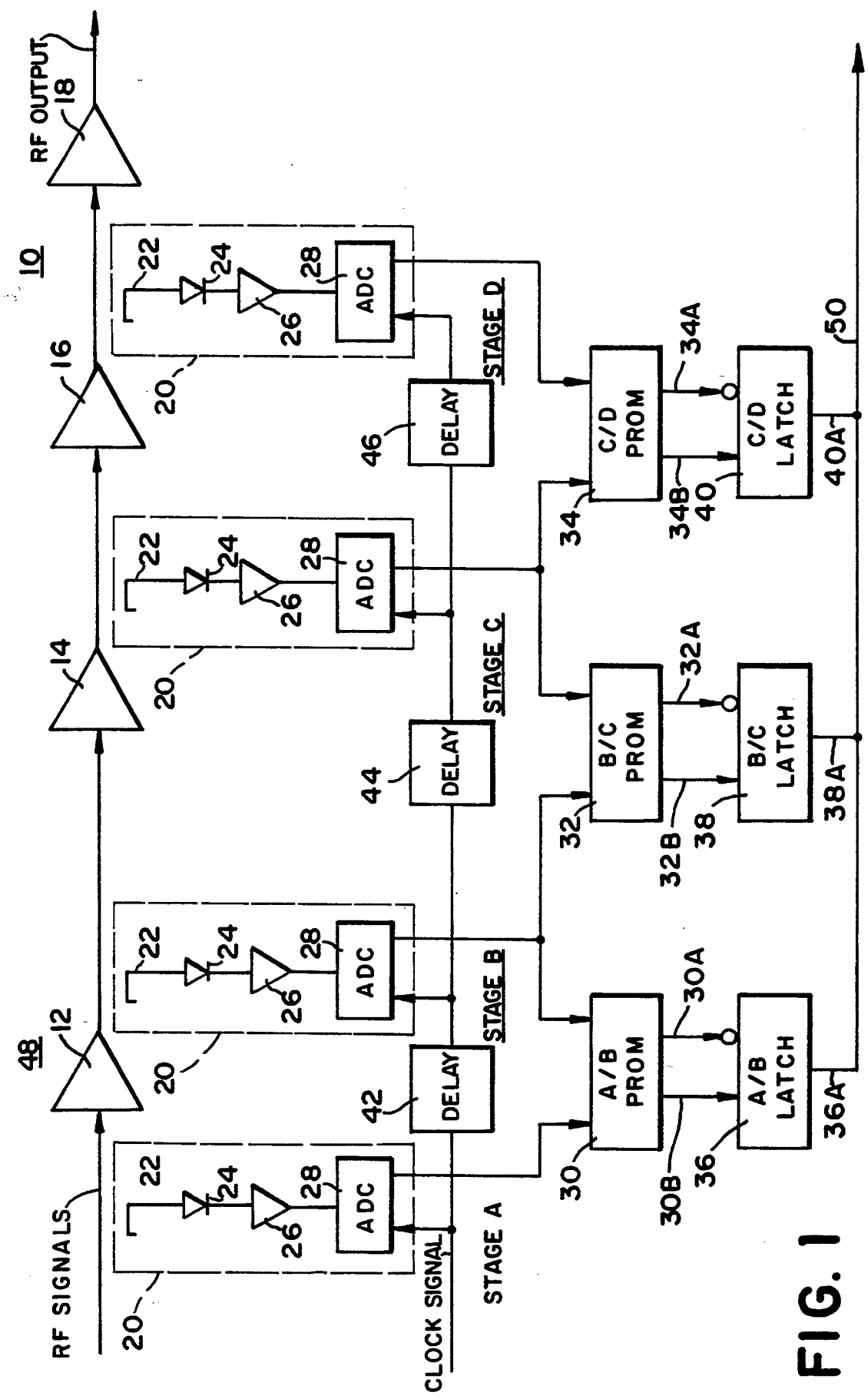
FIG. 1 is a block diagram of the digital amplitude quantizer of the present invention.

Referring to the drawings, wherein like reference numbers indicate like elements, there is shown in FIG. 1 a block diagram of the digital amplifier quantizer 10 of the present invention. In general, the digital amplitude quantizer 10 comprises a circuit arrangement that detects, measures and converts the power level of radio frequency (RF) signals into a digital representation. The quantizer 10 divides such detection, measurement and conversion into subranges or stages each covering a portion of the overall range of the power level of the applied RF signals. The quantizer 10 not only provides for the digital measurement and conversion of transient or continuous RF signals but also has a monotonic response. The digital amplitude quantizer 10 comprises a plurality of elements each performing a functional operation, each having a reference number, each being of a typical type, and all of which are tabulated in Table 1.

TABLE 1

| REFERENCE(S) NUMBERS | ELEMENT | TYPICAL TYPE |
| --- | --- | --- |
| 12 | RF AMPLIFIER | CELERITEC CSA-936072 |
| 14 | RF AMPLIFIER | CELERITEC CSA-936072 |
| 16 | RF AMPLIFER | CELERITEC CSA-936072 |
| 18 | RF AMPLIFIER | CELERITEC CSA-936072 |
| 20 | COUPLING, DETECTING, AMPLIFYING AND ANALOG-TO-DIGITAL CONVERTER MEANS COMPRISING: | |
| •22 | DIRECTIONAL COUPLER | CONVENTIONAL |
| •24 | DETECTOR | MICA TN0002CC01 |
| •26 | VIDEO AMPLIFIER | ANALOG DEVICES AD9618 |
| •28 | ANALOG-TO-DIGITAL CONVERTER | ANALOG DEVICES AD9058 |
| 30 | A/B PROM | CYPRESS CY7C263 |
| 32 | B/C PROM | CYPRESS CY7C263 |
| 34 | C/D PROM | CYPRESS CY7C263 |
| 36 | A/B LATCH | NATIONAL 54FCT374 |
| 38 | B/C LATCH | NATIONAL 54FCT374 |
| 40 | C/B LATCH | NATIONAL 54FCT374 |
| 42 | DELAY | CONVENTIONAL |
| 44 | DELAY | CONVENTIONAL |
| 46 | DELAY | CONVENTIONAL |

The quantizer 10 has a predetermined number (n) of stages and for the embodiment shown in FIG. 1 it has four (4) stages, A, B, C and D. Further, the quantizer 10 has a plurality of serially arranged RF amplifiers of a number (m) which is one less than the number (n) of stages and for the embodiment of FIG. 1 has RF amplifiers 12, 14 and 16. The first or lowermost RF amplifier 12 receives the RF signals to be measured and the last or uppermost RF amplifier 16 provides the final amplification of the received RF signals. The circuit arrangement 10 further comprises an RF amplifier 18 which does not have any part in measuring the RF signals but rather provides for limited RF output signals to an external circuit (not shown). Each of the RF amplifiers 12, 14 and 16, as well as RF amplifier 18, has a designated level limiting its peak amplitude output, an input and an output stage, a preferred dynamic range of 20 db, and a predetermined propogation time. The serially arranged RF amplifiers 12, 14, 16 have a shared signal path 48 that conducts or carries the RF signals.

Each of the stages A, B, C and D has a coupling, detecting, amplifying and analog-to-digital converter means 20, each with an input and an output, and comprises serially arranged elements 20 (directional coupler for coupling), 24 (diode detector for detecting), 26 (video amplifier for amplifying) and 28 (analog-to-digital converter for converting an analog signal to a digital representation). The means 20 are arranged so that one of each is located at the input and output stages of each of the RF amplifiers 12, 14 and 16. The coupling means 22, preferably comprising a microwave coupler or power divider, is adjusted relative to the signal path 48 so as that predetermined portion of the power of the RF signals is transferred thereto when the power level of the RF signals reaches a predetermined value. The amount or level of the power of the RF signals which is transferred to the individual coupler means 22 will be further described with reference to FIG. 2. The transferred RF signals are then sequentially detected by the diode detector 24, amplified by the video amplifier 26, and converted into a digital output by the analog-to-digital converter. Each of the analog-to-digital converter means 28 has a digital output signal that is normally being updated, but which remains relatively steady in response to the output signal developed from RF amplifiers 12, 14 and 18 operating in their limited peak condition. Further, each of these analog-to-digital converters 28 is responsive to a clock signal.

The outputs of the analog-to-digital converters 28 of adjacent stages A and B are routed to a shared A/B PROM 30. Similarly, the outputs of the analog-to-digital converters 28 of adjacent stages B and C are routed to a shared B/C PROM 32 and, similarly, the ouputs of the analog-to-digital converter-28 of adjacent stages C and D are routed to a shared C/D PROM 34. Each of the PROMs 30, 32 and 34 has prestored information that produces both a control signal (30A, 32A and 34A respectively) and a digital output signal. The control signals (30A, 32A and 34A) and digital output signals (30B, 32B and 34B) of PROMs 30, 32, 34 are respectively routed to the A/B latch 36, the B/C latch 38, and the C/D latch 40. Each of the latches A/B 36, B/C 38 and C/D 40 has a tri-state output, i.e., the output has three possible states those being a high (logic "1"), a low (logic "0") or an open circuit. The latches A/B 36, B/C 38, and C/D 40 respectively provide output signals 36A, 38A and 40A which are combined, to be described, to form a composite digital representation 50.

The quantizer 10 preferably further comprises a serial arrangement of delay devices 42, 44 and 46; wherein the first delay device 42 receives the clock signal. The delay device 42 is interposed between the analog-to-digital converters 28 of stages A and B, the delay device 44 is interposed between the analog-to-digital converters 28 of stages B and C, and, finally, the delay device 46 is interposed between the analog-to-digital converters 28 of stages C and D. The delay devices 42, 44 and 46 are selected to provide a time delay that respectively matches the inherent propogation time of RF amplifiers 12, 14 and 16. The time delays provided by the delay devices 42, 44 and 46 are such that the clock signal always selects or samples a particular duration of the RF input signals so as to allow the measurement of the half-power points of the applied RF signals. Although FIG. 1 shows the anolog-to-digital converter 28 and the delay device 42 of the quantizer 10 as receving a clock signal so as to be sampled at a particular duration, the quantizer 10 performs equally well in response to a triggered pulse generated by a one-shot multivibrator. Furthermore, although the operation of the quantizer 10 is primarily concerned with digital aspects, it also has analog aspects which may be further described with reference to FIG. 2.

FIG. 2 has a Y axis showing the output level (given in millivolts (mV)) of the video amplifier 26 for each of the stages A, B, C and D, and a X axis showing the power level (given in dBm) of the RF signals applied to the quantizer 10. FIG. 2 further illustrates four plots 52 (stage D); 54 (stage C); 56 (stage B); and 58 (stage A). Each of the plots 52, 54 and 56 respectively have an initial portion (52A, 54A and 56A) and a final portion (52B, 54B and 56B). The plot 56 has an initial portion 58A. It should be noted that the initial portion 54A starts to smoothly rise as portion 52B beings to approach its knee region; similarly, initial portion 56A starts to smoothly rise as portion 54B approaches its knee region; and, finally, initial portion 58A starts to smoothly rise as portion 56B approaches its knee region.

In operation, and with reference to both FIGS. 1 and 2, the RF input signals are amplified by the three (3) RF amplifiers 12, 14 and 16 and then coupled to and detected by the directional coupler 22 and detector 24 of stage D. The detected RF signals, which may be of a video type containing other information, are amplified by video amplifier 26 of stage D (see Y axis of FIG.2) and then digitized by the analog-to-digital converter 28 of stage D. As the power of the RF power level is increased (see X axis of FIG. 2) the RF amplifier 16 is driven into its limiting condition so that the analog-to-digital converter 28 of stage D no longer senses a changing condition and thereby provides a relatively constant digital output. At a power level (see initial portion 54A of FIG. 2) somewhat lower than that required to place the RF amplifier 16 into its limiting operation, the RF power level developed by RF amplifier 14 that is coupled to the directional coupler 22 of stage C is sufficient to activate that directional coupler 22 and thereby allow for the coupled RF signals to be detected by diode 24 of stage C, amplified by amplifier 26 of stage C and digitized by analog-to-digital converter 28 of stage C. Further increases in the input power level (see X axis of FIG. 2) cause the RF amplifier 14 to be driven into its limiting condition which is responded to by the related analog-to-digital converter 28 of stage C providing a relatively steady state digital output. At a power level (see initial portion 56A of FIG. 2) somewhat lower than that required to place RF amplifier 14 into limiting operation, the RF level developed by the RF amplifier 12 that is coupled to directional coupler 22 of stage B is sufficient so as to activate that directional coupler 22 and thereby allow for the coupled RF signals to be detected by diode 24 of stage B, amplified by amplifier 26 of stage B and digitized by analog-to-digital converter 28 of stage B. Again, further increases in the input power cause the RF amplifier 12 to go into its limiting condition which, in turn, allows the directional coupler 22 of stage A to receive a sufficient amount of power to allow for stage A to perform its detection (diode 24), amplification (amplifier 26) and digitation (analog-to-digital converter 28) of the applied RF signals. As seen in FIG. 2, the plots 52, 54, 56 and 58 respectively show that the operation of stages A, B, C and D essentially provides for separate detection and amplification of a portion of the power level of the RF signals applied to the quantizer 10. The composite response of plots 52, 54, 56 and 58 covers the overall range of the power of RF signals applied to the quantizer 10. Each of the portions of the analog RF signals represented by the plots 52, 54 and 56 are digitized so as to provide a combined digital representation 50.

The digital representation 50 of the digital amplifier quantizer 10 is preferably an eight (8) bit digital word that indicates the measured power level of the RF signals. The power levels of typical RF signals measured by the present invention and indicated by a digital eight (8) bit representation is given in Table 2.

TABLE 2

| POWER LEVEL OF RF SIGNALS (dBm) | NUMERICAL VALUE | BINARY VALUE |
|---|---|---|
| −80 | 0 | 0000 0000 |
| −70 | 20 | 0001 0100 |
| −60 | 40 | 0010 1000 |
| −50 | 60 | 0011 1100 |
| −40 | 80 | 0101 0000 |
| −30 | 100 | 0110 0100 |
| −20 | 120 | 0111 1000 |
| −16 | 128 | 1000 0000 |
| −10 | 140 | 1000 1100 |
| 0 | 160 | 1010 0000 |
| +10 | 180 | 1011 0100 |
| +20 | 200 | 1100 1000 |
| +30 | 220 | 1101 1100 |
| +40 | 240 | 1111 0000 |
| +47.5 | 255 | 1111 1111 |

From Table 2 it is seen that the quantizer 10 in a typical operation measures the power level of the applied RF signals in a range from −80 dBm to +47.5 dBm which respectively yields numerical values from 0 to 255, and binary values from 0000 0000 to 1111 1111. The granularity or bit weight of each of the binary bits is selected to be 0.5 dB.

From Table 2, it is seen with the coding scheme selected, RF signals with a power level below −16 dBm cause the binary most significance bit (MSB) of the binary value to be set to zero. The MSB of each of the PROMs 30, 22 and 34, in conjunction with associated logic within the PROMs, is used to respectively enable latches 36, 38 and 40. The B/C PROM 32 and the C/D PROM 34 employ the unused MSB, caused by power levels below −16 dBm, to enable their respective B/C latch 38 and C/D latch 40. Conversely, the most significant bit (MSB) transition (0 to 1) occurs at the −16 dBm measurement and is directly employed by the A/B PROM 30 to enable its associated A/B latch 36.

For applied RF signals having power levels below −40 dBm, the MSB output of the C/D PROM 34 enables the C/D latch 40 by way of its control line 34A. For applied RF signals having power levels between −40 dBm and −16 dBm, the MSB of the B/C PROM 32 enables the B/C latch 38 by way of its control signal 32A. Above −16 dBm power levels, the MSB of the A/B PROM enables the A/B latch 36 by way of its control signal 30A. The PROM 30, 32, or 34 which is enabled for each segment of the applied input power given in Table 2 is illustrated in Table 3.

TABLE 3

| INPUT POWER RANGE (dBm) | STAGES(S) SUPPLYING DATA | PROM ENABLED |
|---|---|---|
| > −60 | D | C/D Prom |
| −60 to −40 | C and D | C/D Prom |
| <−40 to −16 | B and C | B/C Prom |
| <−16 to 0 | A and B | A/B Prom |
| <0 to +47.5 | A | A/B Prom |

In addition to illustrating which PROM (A/B, B/C or C/D) is enabled during which portion of the input power range, Table 3 further illustrates which stage A, B, C or D provides the data for the enabled PROM. From Table 3 it is seen that different portions of the input power range share data from adjacent stages A, B,-C and D. The shared data is combined by the respectively enabled PROM shown in Table 3. The data is combined by a predetermined algorithm or routine running in each PROM and that defines a quantity herein termed RATIO. The RATIOS for the C/D PROM 34, B/C PROM 32 and A/B PROM 30 may be termed $R_3$, $R_2$, and $R_1$ respectively and such RATIOS have relationships shown by expressions 1, 2 and 3 given below:

$$R_3 = \frac{(C - 31.5)}{(D - 31.5)} \quad (1)$$

$$R_2 = \frac{(B - 31.5)}{(C - 31.5)} \quad (2)$$

$$R_1 = \frac{(A - 31.5)}{(B - 31.5)} \quad (3)$$

where the quantities A, B, C and D respectively represent the data of stages A, B, C and D and the quantity 31.5 corresponds to the mid-point of the available digital data, ranging over 0 to 63 bits. For mid-range quantities, for example, for "B" of $R_2$ near mid-range, the actual value of "C" has little effect because the most accurate portion of the digital data is at the mid-range as may be seen in FIG. 2 where in the mid-range of the plots 52, 54, 56 and 58 are linearly increasing functions. The mid-range of plots 52, 54, 56 and 58 dominates over the lower extremes of plots 52, 54, 56 and 58 covering a relatively small signal region. This domination also exists over the upper extremes of plots 52, 54, 56 and 58 that are largely determined by the limiting characteristic of the RF amplifiers 12, 14 and 16.

The algorithms or routines running in each of the PROM preferably further compute, from theoretical data, the ideal ratios ($R_1$, $R_2$, and $R_3$) corresponding to each of the related RF power input levels (see, for example, Table 2), and then compute all the possible values, for example, "B" and "C" data, which can produce RATIO ($R_2$). In actuality, the PROMS are programmed with the RF output level which corresponds to each of these pairs of values. For example, the B/C PROM 32 in order to derive the RATIO $R_2$ is programmed with the RF output level which corresponds to each of the pairs of values for "B" and "C."

It should now be appreciated that the digital amplitude quantizer 10 has a monotonic operation, whereby increases in the RF input power level of the applied RF signals to be measured cause smooth increases in the digital output data. The quantizer 10 accomplishes such a monotonic operation by subdividing the overall dynamic power range, desired to be measured, into selected portions for processing by associated stages. The quantizer 10 assigns a predetermined number of stages each having an analog-to-digital converter that supplies digital data that is combined into a composite digital data output having an overall eight (8) bit binary representation. The quantizer 10 utilizes fixed digital algorithms for each of its PROMs that is not susceptible to variations, such as those caused by temperature or frequency changes, and in so doing provides for an accurate digital measurement of the power level of the applied RF signals.

Further, the quantizer 10 uses components that allow for a relatively quick recovery time, such as about 50 nanoseconds. In addition, the quantizer 10 further preferably utilizes delay devices 42, 44 and 46 so that any selecting or sampling of the RF signals present at any of the stages A, B, C or D of the quantizer 10, always occurs so as to capture and measure the half-power points of the RF signals.

The quantizer 10 achieves an essential feature of the present invention by the use of the previously described RATIO and by combining data from adjacent ranges into one PROM to assure monotonicity. A second essential feature is the delay of the clock trigger to compensate for the propagation time through the RF circuts.

It should now be appreciated that the present invention not only teaches the use of a digital amplifier quantizer to accurately measure the level of power on the radio frequency signals, but also teaches the benefits of the use of digital techniques for the measurement of analog type signals. These digital techniques ere not limited to providing an eight (8) bit digital representation previously described, but may use any digital representation that fits the need of the RF signals being measured.

In addition to providing a digital amplitude quantizer 10, the present invention also teaches the principles of measuring the level of power of any RF signal having a predetermined power range by dividing such range into a number of portions and then assigning equipment to accurately measure and provide a digital representation of each of these portions which individual representation is further combined to provide a composite digital representation covering the. Overall range of the level of power of the applied RF signals.

What I claim is:

1. A digital amplitude quantizer for measuring a predetermined range of the level of power of applied RF signals by dividing the range into a predetermined number (n) of portions, with each portion being assigned an operating stage, said digital amplitude quantizer comprising:

(a) a predetermined number (m), which is less than said number (n), of serially arranged RF amplifiers and the first of which RF amplifier receives an RF signal to be measured and the last of which RF amplifier provides the final amplification of said received RF signal, said serial arranged RF amplifiers having a signal path carrying said RF signals, each of said RF amplifiers having an input and output stage, a designated level limiting its peak amplitude output and a predetermined propagation time;

(b) a predetermined number, which corresponds to said number (n), of serially arranged coupling, detecting, amplifying and analog-to-digital converting means each having an input and an output and being arranged so that one of each serial arrangement is located at the input and output stages of each of the RF amplifiers, said coupling means being adjusted relative to said signal path so as to have a respective portion of the power level of said RF signals, transferred thereto when said RF signals reach a predetermined level of power;

(c) a predetermined number, which corresponds to said number (m), of parallel arranged PROMs having prestored information and interconnected between the outputs of adjacent analog-to-digital converter means, each of said PROMs providing a control signal and a digital output word having a predetermined number of bits; and (d) a predetermined number, which corresponds to said number (m), of latches each arranged to receive said digital output word of a respective PROM in response to said control signal of said respective PROM.

2. A digital amplitude quantizer according to claim 1, wherein said predetermined number (n) is of a value four (4) and wherein each RF amplifier is selected to have a dynamic range of about 20 db.

3. A digital amplitude quantizer according to claim 2, wherein said predetermined range extends from about $-80$ dBm to about $+48$ dBm and said serially arranged coupling, detecting, amplifying and analog digital converting means are segmented into fourth, third, second and first operating stages and said coupling means are respectively adjusted to have said RF signal transferred thereto when said RF signals are about $-80$ dBm to less than about $-40$ dBm, between about $-40$ dBm to less than about $-16$ dBm, between about $-16$ dBm to about 0 dBm, and between about 0 dBm to about $+48$ dBm.

4. A digital amplitude quantizer according to claim 2, wherein said predetermined number (m) of parallel arranged PROMs is of a value three (3) and each PROM provides a five (5) digital word having a most significant bit and wherein the third, second, and first of the PROMs respectively receive the output of the analog-to-digital converting means of said fourth and third, third and second, and second and first stages.

5. A digital amplitude quantizer according to claim 4, wherein said predetermined number (m) of latches is of a value three (3) and are arranged to receive the digital outputs of said third, second and first PROMs and the most significant bit of said third, second and first respectively generate said control signals to the respective latches.

6. A digital amplitude quantizer according to claim 1, wherein the output of the analog-to-digital converting means remains relatively steady in response to an input developed from an RF amplifier operating at its limited peak output.

7. A circuit arrangement according to claim 1, wherein said analog-to-digital converters are responsive to a clock signal.

8. A circuit arrangement according to claim 7 further comprising a predetermined number (m) of delay means each having a predetermined delay time, said delay means being arranged in series with the first receiving said clock signal and each delay means being interposed between respective inputs of adjacent said analog-to-digital converting means.

9. A circuit arrangement according to claim 8, wherein said predetermined delay time of each of said delay means are selected to correspond to said predetermined propagation time of said RF amplifiers so that said analog-to-digital converting means are activated to be sampled at the half-power points of said RF signals.

10. A digital amplitude quantizer according to claim 1 further comprising an additional RF amplifier for receiving the output signal developed by said serially arranged RF amplifiers.

11. A digital amplitude quantizer according to claim 4, wherein each of said PROMs generate said five (5) bit digital word having sixty-three (63) binary bits.

12. A digital amplitude quantizer according to claim 11, wherein said third, second and first PROMs respectively have a routine for generating digital outputs in accordance with the following ratios $R_3$, $R_2$, and $R_1$:

$$R_3 = \frac{(C - 31.5)}{(D - 31.5)} \quad (1)$$

$$R_2 = \frac{(B - 31.5)}{(C - 31.5)} \quad (2)$$

$$R_1 = \frac{(A - 31.5)}{(B - 31.5)} \quad (3)$$

where the quantities A, B, C and D respectively correspond to said first, second, third and fourth operating stages.

13. A digital amplitude quantizer according to claim 12, wherein said third, second and first PROMs further have a routine for generating ideal values for ratios $R_3$, $R_2$ and $R_1$ from quantities corresponding to the dBm output received from the analog-to-digital converting means of said fourth, third, second and first stages, said PROMs having further routines for calculating the outputs of the fourth, third, second and first analog-to-digital converters that can produce these ideal values for ratios $R_3$, $R_2$ and $R_1$, and then, finally, said PROMs having further routines for comparing said calculated outputs of said analog-to-digital converters against said ratios $R_3$, $R_2$, and $R_1$.

14. A method for measuring a predetermined range of the level of power of applied RF signals comprising the steps of:

(a) dividing said overall range into a predetermined number of portions (n) each having a stage;

(b) providing a predetermined number (m), which is less than said number (n), of serially arranged RF amplifiers and the first of which RF amplifier receives the RF signal to be measured and the last of which RF amplifier provides the final amplification of said received RF signal, said serially arranged RF amplifiers having a signal path carrying said RF signals, each of said RF amplifiers having input and output stages, a designated level limiting its peak amplitude output, and a predetermined propagation time;

(c) providing a predetermined number, which corresponds to said number (n), of serially arranged coupling, detecting, amplifying and analog-to-digital converting means each having an input and an output and being arranged so that at least one of each serial arrangement is located at the input and output stages of each of the said RF amplifiers, said coupling means being adjusted relative to said signal path so as to have a respective portion of the power level of said RF signals transferred thereto when said RF signals reach a predetermined level of power;

(d) providing a predetermined number, which corresponds to said number (m), of parallel arranged PROMs each having prestored information and interconnected between the outputs of adjacent analog-to-digital converter means, each of said PROMs providing a control signal and a digital output word having a predetermined number of bits; and (e) providing a predetermined number, which corresponds to said number (m), of latches each arranged to receive said digital output word of a respective PROM and each being responsive to said control signal of said respective PROM.

15. A method according to claim 14, wherein each of said RF amplifiers are selected to have a dynamic range of 20 db.

16. A method according to claim 15, wherein said predetermined range extends from about −80 dBm to about +48 dBm and said serial arranged coupling, detecting, amplifying and analog-to-digital converting means are segmented into fourth, third, second and first operating stages and said coupling means are respectively adjusted to have said RF signals transferred thereto when said RF signals are about −80 dBm to less than about −40 dBm, between about −40 dBm to less than about −16 dBm, between about −16 dBm to less than about 0 dBm, and between about 0 dBm to about +48 dBm.

17. A method according to claim 16, wherein said predetermined number (m) of parallel arranged PROMs is of a value three (3) and each provides a five (5) bit digital word having a most significant bit and wherein the third, second and first of the PROMs receive the output of the analog-to-digital converters of said fourth and third, third and second, and second and first operating stages.

18. A method according to claim 14, wherein said analog-to-digital converter means is responsive to a clock signal.

19. A method according to claim 18 further comprises providing a predetermined number (m) of delay devices each having a predetermined delay time, said delay means being arranged in series with the first receiving said clock signal and each of said delay devices being interposed between respective inputs of adjacent analog-to-digital converter means.

20. A method according to claim 19, wherein said predetermined delay time of each of said delay devices are selected to correspond to said predetermined propagation time of said RF amplifiers so that said analog-to-digital converting means are activated to be sampled at the half-power points of said RF signals.

* * * * *